United States Patent [19]

Seki

[11] Patent Number: 4,568,837

[45] Date of Patent: Feb. 4, 1986

[54] GATE CIRCUIT FOR GATE TURN-OFF THYRISTOR

[75] Inventor: Nagataka Seki, Fuchu, Japan

[73] Assignee: Tokyo Shibaura Denki Kabushiki Kaisha, Kanagawa, Japan

[21] Appl. No.: 557,542

[22] Filed: Dec. 2, 1983

[30] Foreign Application Priority Data

Dec. 3, 1982 [JP] Japan .................................. 57-211318

[51] Int. Cl.[4] ...................... H03K 17/72; H03K 17/08
[52] U.S. Cl. ................................. 307/252 C; 307/263; 307/264
[58] Field of Search ................... 307/252 C, 260, 263, 307/264

[56] References Cited

U.S. PATENT DOCUMENTS 3,681,677  8/1972  Badal .
4,464,585  8/1984  Seki .................................. 307/252 C

FOREIGN PATENT DOCUMENTS 56-136023  10/1981  Japan .

Primary Examiner—John Zazworsky
Attorney, Agent, or Firm—Oblon, Fisher, Spivak, McClelland & Maier

[57] ABSTRACT

A gate circuit for turning off a gate turn-off thyristor providing a signal of rapid voltage rise and high peak value followed by successive signals of low peak value. The circuit uses a pulse transformer, whose primary winding is divided at least into three windings, which is associated with three winding capacitors which are respectively connected with the connection points of the divided primary windings.

6 Claims, 8 Drawing Figures

GATE CIRCUIT FOR GATE TURN-OFF THYRISTOR

BACKGROUND OF THE INVENTION

1. Field of the Invention:

The present invention is related to a semiconductor element gate circuit and more particularly to a gate circuit of a gate turn-off thyristor.

2. Description of the Prior Art:

High power gate turn-off thyristors (GTO) have been developed in recent years whose voltages and turn-off current are approximately 2500 volts and 1400 amperes respectively. These GTO's are commercially available and are supplied for use with inverters or choppers. The value of the anode current which can be turned off by negative current flowing to the gate of the GTO is expressed by the term "turn-off current" and is identified as $I_{TGQ}$. The negative minimum current which flows to the gate for turning off the GTO is identified by $I_{GQ}$ with the ratio $I_{TGQ}/I_{GQ}$ being termed the turn-off gain which has a value of between 3 and 5.

Consequently, a current of approximately 300 amps must flow in the gate in order to turn off a GTO of $I_{TGQ}=1000$ A. It is required that the gate trigger current to turn on the GTO has approximately the same order of magnitude as an ordinary thyristor. Once a large gate current flows in the negative direction, the GTO can be reignited even if a slight gate current flows in a positive direction. The gate current is inverted, for example, by the effect of the stray inductives between a pulse transformer and the GTO in the gate circuit utilizing capacitor discharge. Even inserting a high speed diode in the output terminal of a secondary winding of the pulse transformer has no effect in preventing this phenomena, because a current flows corresponding to the amount of the inverse recovery charge.

The gate circuit of FIG. 1 attempts to deal with this phenomena with the circuit being described in U.S. patent application Ser. No. 242,158 filed Mar. 9, 1981. In order to provide a simple explanation of its operation, the FIG. 1 shows a DC power supply 11, a diode 12, a capacitor 13, a pulse transformer 14 and the primary windings 15 and 16 of the pulse transformer 14. A secondary winding 17 of the pulse transformer 14, a transistor 18, a GTO 19 and a diode 20 complete the FIG. 1.

If the voltage of the DC power source 11 is represented by the voltage E and the voltage of the capacitor 13 as $E_C$ then the voltage $E_C$ in the steady state becomes larger than the voltage E.

Assuming that the number of turns of the primary windings 15 and 16 are equal and that the ratio of the number of turns of the primary winding 15 or 16 to that of secondary winding 17 is $n_1$, then the following observations with regard to the FIG. 1 are in order.

When the transistor 18 is turned on, the voltage $E_C$ is applied to the terminals B-C of the primary windings 16, and the potential of the point A becomes the voltage $2E_C$.

Thus, the diode 12 is reverse-biased and no current flows from the DC power source 11. A voltage $E_C/n_1$ appears on the secondary winding 17. If the resistance of the GTO 19, as seen from the primary winding 15 or 16, is labeled R and the capacitor of the capacitor 13 is C, the capacitor 13 discharges with the time-constant CR and the voltage across the two terminals of the capacitor 13 quickly reach the voltage E/2. The potential of the point A then becomes the voltage E and the capacitor voltage $E_C$ drops slightly. The diode 12 is then forward-biased and becomes conductive. As a result, the voltage E is applied to the series circuit of the primary windings 15 and 16 of the pulse transformer 14, and the voltage of the secondary winding 17 is reduced to $E/2n_1$.

When the transistor 18 turns off, part of the excitation energy of the pulse transformer 14 goes to the GTO 19, while the remainder of the excitation energy is used for charging the capacitor 13. Most of the excitation energy of the pulse transformer 14 is used to charge the capacitor 13 and consequently the voltage $E_C$ becomes larger than the voltage E.

The gate circuit of FIG. 1 is used in a GTO off-gate circuit, however, with a further increase of the GTO turn-off current $I_{TGQ}$, the following problems arise when, for example, $I_{TGQ}=3,000$ A:

(i) The stray inductance between the GTO gate and a pulse transformer is ordinarily $1\mu$ H, so that the current arise $di_{RG}/dt$ of the gate turn-off current $I_{GQ}$ is approximately 30 A/$\mu$s. Assuming that 1,000 A is necessary for gate turn-off current $I_{GQ}$, the period T taken for the gate turn-off current to reach 1,000 A will be at least 33 $\mu$s. Because, in reality, the decrease of the anode current is even further delayed than exemplified above, an obstacle will have been presented to a 1 KHz switching operation;

(ii) An increase in the voltage of the secondary winding of the pulse transformer causes a rise in the gate turn-off current $I_{GQ}$. The voltage of the secondary winding of the pulse transformer 14 is presently approximately 30 to 40 volts. In the instance where the voltage of the secondary winding is 100 volts, $di_{rG}/dt$ is made 3 times larger than that of the pulse transformer 14. Thus, the period T is reduced to approximately ⅓ of that of the pulse transformer 14 whose voltage of the secondary winding is approximately 30 to 40 volts. However, the reverse breakdown voltage across the gate-cathode of the GTO is approximately 15 volts so that it is undesirable to apply high voltage across the gate cathode in the condition in which there is no GTO anode current. This is so because not only would this high voltage lead to large losses in gate circuit but it might also lead to local heating of the GTO itself. Therefore, simply raising the voltage does not provide for an appropriate solution to this problem.

SUMMARY OF THE INVENTION

The object of the present invention is to provide a gate circuit for a gate turn-off thyristor which enables high speed operation.

Another object of the invention is to provide a gate circuit for a gate turn-off thyristor which prevents the gate turn-off thyristor from overheating.

In order to achieve these objects, the present invention provides that a primary winding of the pulse transformer is divided into at least three windings, which are successively excited. This allows for the generation of a signal of rapid voltage rise and high peak value followed by successive signals of low peak values.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 2:
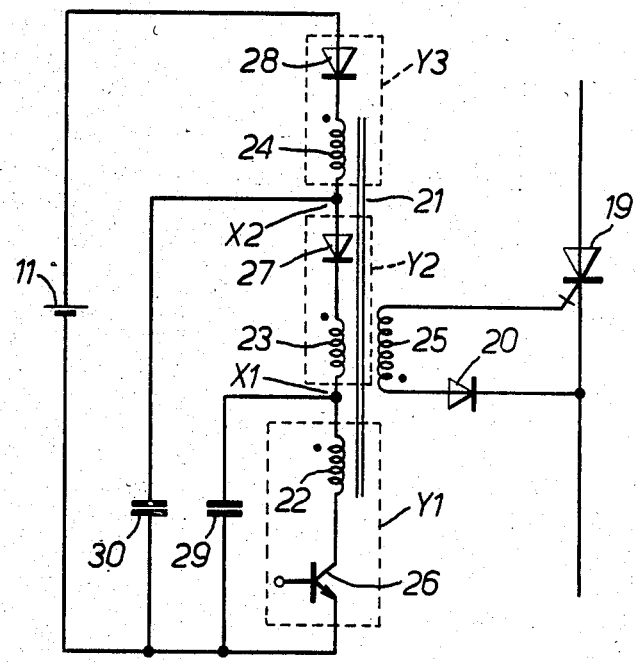
FIG. 2 is a circuit diagram of a gate circuit according to the embodiment of the present invention.

Referring now to the drawings, wherein like reference numerals designate identical or corresponding parts throughout the several views, and more particularly, to FIG. 2 thereof, a circuit diagram is illustrated showing an embodiment of the present invention. A pulse transformer 21 is disclosed having a primary winding which is divided into a first primary winding 22, a second primary winding 23 and a third primary winding 24 which provides for the generation of the required gate signal in the secondary winding 25.

A first circuit $Y_1$ consists of the first primary winding 22 of the pulse transformer 21 and a switching element 26 such as a transistor. The first primary winding 22 is connected in series with the switching element 26. A second circuit $Y_2$ consists of the second primary winding 23 of the pulse transformer 21 and a diode 27. The second primary winding 23 is connected in series with a diode 27. Similarly, a third circuit $Y_3$ consists of the third primary winding 24 of the pulse transformer 21 and a diode 28. The third primary winding 24 is connected in series with the diode 28.

The first, second and third circuits $Y_1$, $Y_2$ and $Y_3$ are connected in series, and this series circuit containing the circuits $Y_1$, $Y_2$ and $Y_3$ is connected with the DC power source 11. A capacitor 29 is connected in parallel with the first circuit $Y_1$ and a capacitor 30 is connected in parallel with a series circuit containing the circuits $Y_1$ and $Y_2$.

One terminal of the secondary winding 25 of the pulse transformer 21 is connected with the anode of the diode 20. The cathode of the diode 20 is connected with the cathode of the GTO 19. Another terminal of the secondary winding 25 is connected with the gate of the GTO 19.

The operation of the circuit of FIG. 2 will now be detailed. If the voltage to which the capacitors 29 and 30 is charged in the steady state after the switching element 26 is turned off is $E_{C1}$ and $E_{C2}$ respectively ($E_{C1} > E_{C2} > E$) and if the winding ratios with respect to the number of turns of the secondary winding 25 of the pulse transformer 21 and that of the first, second and third primary windings 22, 23 and 24 are respectively $n_1$, $n_2$ and $n_3$, then the following operation will occur.

When the switching element 26 is turned on, the voltage $E_{C1}$ is applied across the two terminals of the first primary winding 22 of the pulse transformer 21. At that time, voltages $E_{C1}n_2/n_1$ and $E_{C1}n_3/n_1$ are induced in the terminals of the second primary winding 23 and third primary winding 24, respectively. Consequently, voltages of magnitudes $[E_{C2}-E_{C1}(n_1+n_2/n_1)]$ and $[E-E_{C2}-E_{C1}n_3/n_1]$ in the reverse direction are applied to the diodes 27 and 28 so that these diodes are reverse-biased. Due to this reverse-bias, current is unable to flow in the first and second primary windings 23 and 24. The voltage $E_{C1}/n_1$ ideally appears in the secondary winding 25. The term "ideally" indicates that the voltage drops of the pulse transformers 21, diodes 27 and 28 and switching elements 26 are theoretically zero. A capacitor 29 is discharged at a time constant determined by the capacitance of capacitor 29 and the resistance presented by the GTO 19 to the primary windings 22, 23 . until its voltage reaches $E_{C2}$ ($n_1/(n_1+n_2)$), whereupon the diode 27 becomes conductive. At that time the voltage appearing in the secondary winding 25 is ideally the voltage $E_{C1}/(n_1+n_2)$.

Upon further discharge of the capacitors 29 and 30, i.e., when the voltage of the capacitor 29 reaches $E(n_1+n_2)/(n_1+n_2+n_3)$, the diode 28 also becomes conductive and thereafter the voltage of the secondary winding 25 is ideally the voltage $E/(n_1+n_2+n_3)$. When the switching element 26 is turned off, part of the excitation energy stored in the pulse transformer 21 goes to the GTO 19 and the remainder goes to charging of the capacitors 29 and 30. If the excitation energy is 0, the voltages $E_{C1}$ and $E_{C2}$ and E are equal. Consequently, the capacitor voltages $E_{C1}$ and $E_{C2}$ must be made higher than the voltage E of the DC power source 11.

Figure 3:
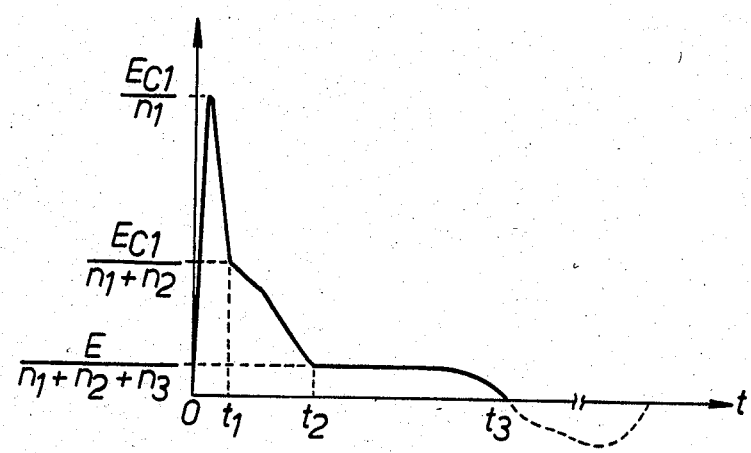
FIG. 3 is a waveform diagram explaining the operation of the circuit of FIG. 2.

FIG. 3 details the ideal voltage waveform which appears on the secondary winding 25 of the pulse transformer 21. If the turn-on starting time of the switching element 26 is zero, the times when the diodes 27 and 28 respectively begin to conduct are indicated as $t_1$ and $t_2$, and the time when the voltage of the secondary winding 25 crosses zero after the switching element 26 is turned off is designated as $t_3$.

Figure 1:
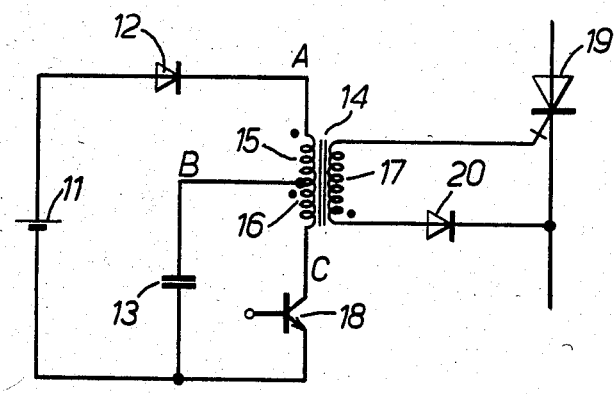
FIG. 1 is a circuit diagram of a prior art gate circuit.

After the occurrence of the time $t_3$, a reverse-polarity voltage appears in the secondary winding 25 of the pulse transformer 21 until the charging of the capacitors 29 and 30 is completed. However, this reverse-polarity voltage (voltage of such a polarity which will turn on the GTO 19) can be stopped by the diode 20 inserted in the gate circuit of the GTO 19. It should be noted that the value dv/dt is small, so that the inverse recovery charge is extremely small and the reverse-polarity current is practically zero. This means that, as in FIG. 1, its effect is also not lost in the present invention. The waveform characteristics of FIG. 3 therefore show three waveforms: a high peak voltage during the period from 0 to $t_1$; an intermediate voltage during the period $t_1$ to $t_2$, and a low voltage which continues for a long period of time during the period from $t_2$ to $t_3$.

Accordingly, according to this invention, a rapid current rise occurs in the period from 0 to $t_1$ and then, during the period $t_1$ to $t_2$, a sufficient current is supplied to exhaust the storage carriers in the interior of the GTO 19. Then, during the period $t_2$ to $t_3$, a current path is formed sufficient for the anode current that remains after the decay to continue to be fed to the gate. Furthermore, as previously indicated, the conventional circuit (FIG. 1) is subject to many design restrictions due to the fact that the period of current rise and the period of exhaustion of storage carriers are not separated.

Figure 4:
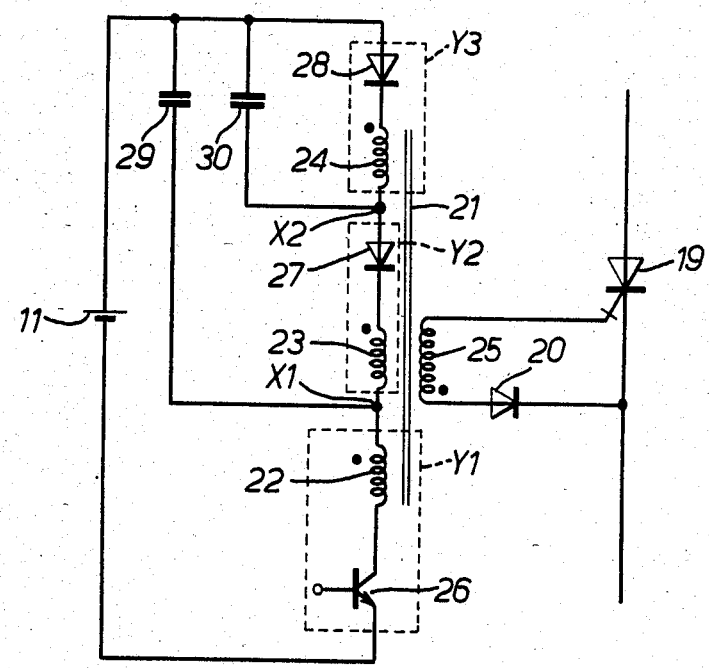
FIGS. 4–8 are circuit diagrams of other embodiments of the present invention.

FIG. 4 is a block diagram of another embodiment of the present invention wherein, as mentioned in FIG. 2, the first, second and third circuits $Y_1$, $Y_2$ and $Y_3$ are connected in series and this series circuit containing the circuits $Y_1$, $Y_2$ and $Y_3$ is connected with the DC power source 11. The capacitor 29 in FIG. 4 is connected in parallel with a series circuit containing the circuits $Y_2$ and $Y_3$. The capacitor 30 is connected in parallel with the third circuit $Y_3$. Furthermore, as shown in FIG. 4, the same effect as that of FIG. 2 can be obtained by connecting the other terminals of the capacitor 29 and 30 to the positive terminal of the DC power source 11. The circuit diagram of FIG. 4 may be considered as still displaying the essence of Applicants' invention notwithstanding the fact that it exhibits some increases in the ripple of the DC power source and some increase in the stray reactance in the loop constituted by the DC power source 11, capacitor 29, first primary winding 22 and the switching element 26, through which the current flows immediately after the switching element 26 is provided with a turn-off signal.

Figure 5:
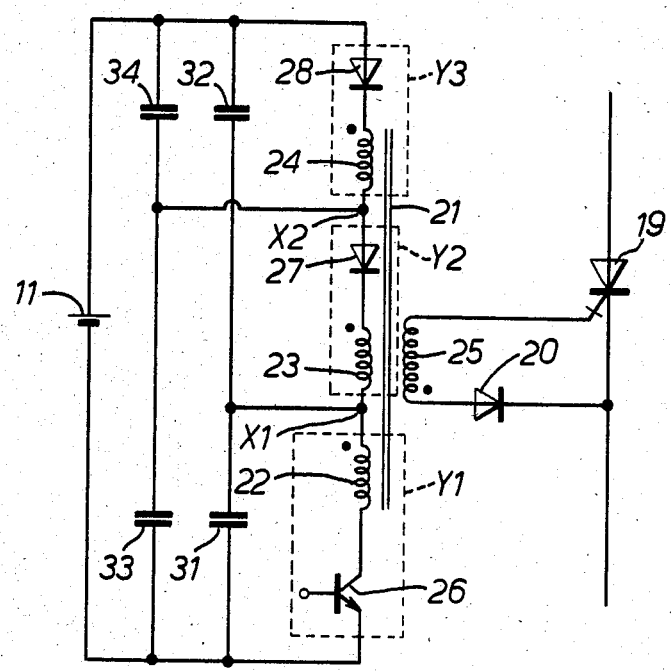

FIG. 5 is a block diagram of another embodiment of the invention wherein, as shown in parts of FIGS. 2 and 4, the first, second and third circuit $Y_1$, $Y_2$ and $Y_3$ are connected in series, and this series circuit containing the circuits $Y_1$, $Y_2$ and $Y_3$ is connected with the DC power source 11. A capacitor 31 is connected in parallel with the first circuit $Y_1$ and a capacitor 32 is connected in parallel with a series circuit containing the circuits $Y_2$ and $Y_3$. A capacitor 33 is connected in parallel with a series circuit containing the circuits $Y_1$ and $Y_2$. A capacitor 34 is connected in parallel with the third circuit $Y_3$.

With reference to the FIG. 5, the capacitor 29 of FIG. 2 and FIG. 4 may have its capacitory $C_{29}$ divided into capacitors 31 and 32. If these capacitances of the capacitors 31 and 32 are designated as $C_{31}$ and $C_{32}$, the device is connected so that it can be $C_{29}=C_{31}+C_{32}$. From an equivalent circuit viewpoint, this is the same as the single capacitance ($C_{31}+C_{32}$) connected in parallel. Thus, the capacitor 29 of FIG. 2 and FIG. 4 may be divided into the capacitors 31 and 32 as shown in FIG. 5. This also applies to the capacitor 30 as shown by the equivalent capacitors 33 and 34.

Figure 6:
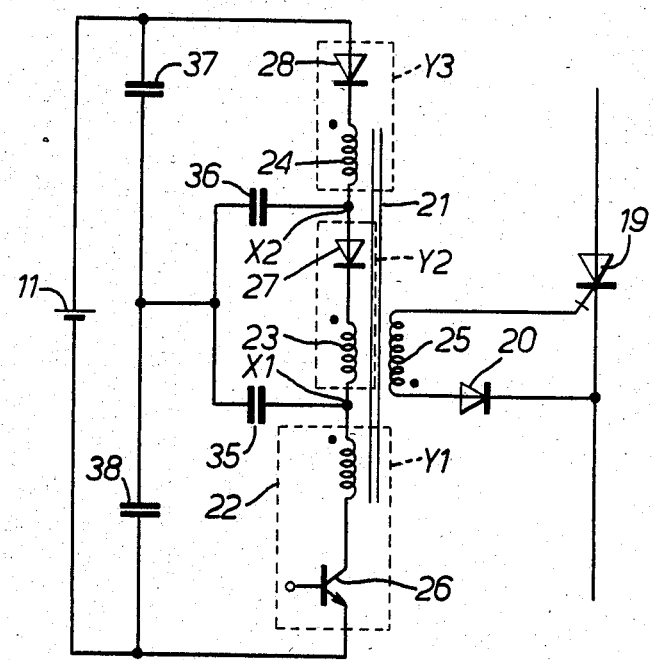

FIG. 6 shows yet another embodiment of the invention in which the capacitors 35 and 36 are connected to the intermediate connection point of two capacitors 37 and 38 which divide the voltage of DC power source 11. This indicates that the same effect is obtained even if the other ends of the capacitors 35 and 36 are connected to a voltage-division point instead of the positive terminal or negative terminal of the DC power source 11.

Figure 7:
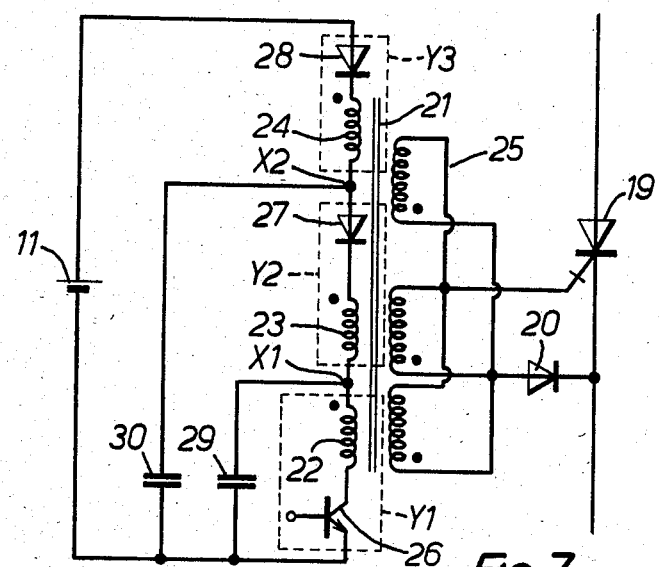

FIG. 7 shows another embodiment of the invention which can be used to reduce stray capacitance and in which the secondary winding 25 of the pulse transformer 21 is divided into three windings. Each of these windings correspond to the first, second and third primary windings 22, 23 and 24. These divided secondary windings are connected in parallel.

Figure 8:
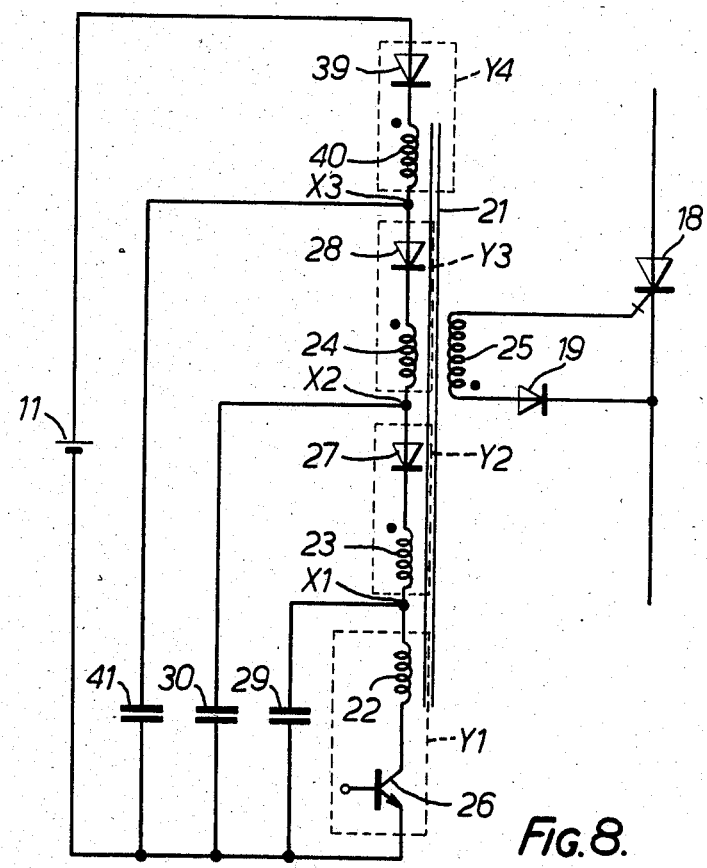

FIG. 8 is a block diagram of another embodiment of the invention wherein the first and second circuits $Y_1$ and $Y_2$ respectively contain the first primary winding 22 and switching element 26, the second primary winding 23 and the diode 27. The third circuit $Y_3$ contains the third primary winding 24 and the diode 28. The primary winding is divided into four windings. The fourth primary winding 40 is connected in series with a diode 39. A fourth circuit $Y_4$ contains a series circuit having the diode 39 and the fourth primary winding 40. The circuits $Y_1$, $Y_2$, $Y_3$ and $Y_4$ are connected in series which is in turn connected with the DC power source 11. The capacitor 29 is connected in parallel with the first circuit $Y_1$, and the capacitor 30 is connected in parallel with a series circuit containing the circuits $Y_1$ and $Y_2$. Furthermore, a capacitor 41 is connected in parallel with a series circuit containing the circuits $Y_1$, $Y_2$ and $Y_3$. By increasing the number of divisions of the primary winding in this manner, the flexibility of circuit design can be increased and the waveform required on the GTO can be easily altered.

Although, in the above description, the switching element has been indicated to be a transistor, for example, other switching elements such as GTO's or FET's could be used in the same manner.

Obviously, numerous additional modifications and variations under the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A gate circuit of a gate turn-off thyristor which comprises:
   a pulse transformer having a secondary winding and a primary winding which primary winding is divided into at least a first, a second and a third winding, a first circuit being formed by connecting a switching element in series with said first primary winding, a second circuit being formed by connecting a first diode in series with said second primary winding, and a third circuit being formed by connecting a second diode in series with said third primary winding wherein said first, second and third circuits are connected in series to a DC power source;
   a gate turn-off thyristor connected to said secondary winding of said pulse transformer;
   at least a first and a second capacitor with said first capacitor having one end connected to the connection point between said first and second circuits and wherein said second capacitor has one end connected to the connector point between said second and said third circuits while the other end of each of said first and second capacitors is connected to said DC power source.

2. A gate circuit of a gate turn-off thyristor according to claim 1, wherein said other ends of said capacitors are connected with the negative terminal of said DC power source.

3. The gate circuit of a gate turn-off thyristor according to claim 1, wherein said other ends of said capacitors are connected with the positive terminal of said DC power source.

4. The gate circuit of a gate turn-off thyristor according to claim 1, wherein said other ends of the said capacitors are connected with a voltage division-point of said DC power source.

5. The gate circuit of a gate turn-off thyristor according to claim 1, wherein the secondary winding of said pulse transformer is divided into a plurality of windings.

6. The gate circuit of a gate turn-off thyristor according to claim 2, wherein at least a third and a fourth capacitor is respectively interposed between said one end of each of said first and second capacitor and said DC power source.

* * * * *